US008552936B2

(12) United States Patent
Hente (10) Patent No.: US 8,552,936 B2
(45) Date of Patent: Oct. 8, 2013

(54) OLED DEVICE WITH CAPACITIVE PROXIMITY SENSING MEANS

(75) Inventor: Dirk Hente, Wuerselen (DE)

(73) Assignee: Koninklijke Philips N.V., Eindhoven (NL)

( * ) Notice: Subject to any disclaimer, the term of this patent is extended or adjusted under 35 U.S.C. 154(b) by 289 days.

(21) Appl. No.: 13/061,157

(22) PCT Filed: Aug. 28, 2009

(86) PCT No.: PCT/IB2009/053761
§ 371 (c)(1),
(2), (4) Date: Feb. 28, 2011

(87) PCT Pub. No.: WO2010/026515
PCT Pub. Date: Mar. 11, 2010

(65) Prior Publication Data
US 2011/0148812 A1 Jun. 23, 2011

(30) Foreign Application Priority Data

Sep. 8, 2008 (EP) .................................... 08105257

(51) Int. Cl.
*G09G 3/30* (2006.01)
*G06F 3/045* (2006.01)

(52) U.S. Cl.
USPC ........................................... 345/76; 345/174

(58) Field of Classification Search
USPC ........................ 345/173, 174, 76, 77, 82, 83
See application file for complete search history.

(56) References Cited

U.S. PATENT DOCUMENTS

| 6,879,319 B2 * | 4/2005 | Cok ............................... 345/173 |
| 7,049,536 B1 | 5/2006 | Marcus et al. |
| 7,098,414 B2 | 8/2006 | Caldwell |
| 7,186,936 B2 | 3/2007 | Marcus et al. |
| 7,242,393 B2 | 7/2007 | Caldwell |
| 8,063,330 B2 * | 11/2011 | Karhiniemi et al. .......... 200/600 |
| 2002/0112942 A1 | 8/2002 | Galmiche et al. |
| 2004/0080267 A1 | 4/2004 | Cok |
| 2005/0088417 A1 | 4/2005 | Mulligan |
| 2006/0113178 A1 | 6/2006 | Soma et al. |
| 2006/0214893 A1 * | 9/2006 | Tseng et al. .................... 345/82 |
| 2007/0068789 A1 | 3/2007 | Streifler |

FOREIGN PATENT DOCUMENTS

| DE | 3816182 A1 | 11/1989 |
| EP | 1691263 A1 | 8/2006 |
| WO | 2007124333 A2 | 1/2007 |
| WO | 2008022866 A1 | 2/2008 |

* cited by examiner

*Primary Examiner* — Kevin M Nguyen
(74) *Attorney, Agent, or Firm* — Mark L. Beloborodov (57) ABSTRACT

An OLED device comprised of: an OLED means, a capacitive proximity sensing means for sensing a change in a capacitance, a mechanical element, and a means to provide a signal, wherein the OLED means and the mechanical element are movable relative to each other upon operation by a user and can assume a first position or a second position, wherein the capacitance is adapted to change between a first capacitance and a second capacitance when the OLED means and mechanical element are moved between the first position and the second position by an operator, and wherein the signal depends upon the capacitance.

12 Claims, 6 Drawing Sheets

OLED DEVICE WITH CAPACITIVE PROXIMITY SENSING MEANS

FIELD OF THE INVENTION

This invention relates to organic light emitting diodes, and in particular to the integration of organic light emitting diodes and capacitive proximity sensors.

BACKGROUND OF THE INVENTION

Organic Light Emitting diodes (OLED) devices are comprised of two electrodes and an organic light emitting layer. The organic layer is disposed between the two electrodes. One electrode is the anode and the other electrode is the cathode. The organic layer is structured such that when the anode has a voltage bias that is sufficiently positive relative to the cathode, holes are injected from the anode and electrons are injected from the cathode. The necessary voltage bias depends upon the materials used for the organic layers. The holes and electrons recombine within the organic layer to induce an exited state in a molecule comprising the organic layer. Light is emitted during the process of excited molecules relaxing to their ground state. The anode is typically manufactured from a high work function material such as a Transparent Conducting Oxide (TCO), and the cathode is typically manufactured from a highly reflecting material such as aluminum or silver. However, there exist many different electrode designs which allow light to exit the cathode, the anode, or through both the cathode and the anode. The organic layer can be comprised of a single organic film, or it can be comprised of a stack of multiple organic films. OLED devices are useful as indicators and displays can be constructed from patterned arrays of OLED devices.

Capacitive switching devices operate by sensing a change in capacitance. Touch sensors are capacitive switching devices that operate by sensing the change in capacitance of an electrode with respect to ground. These types of sensors typically sense the change in capacitance caused by the proximity of an operator's finger. Capacitive switching devices can also function by sensing the capacitance or change in capacitance between two conductive objects.

U.S. Pat. No. 7,242,393 B2 discloses a combined OLED capacitive touch sensor and separately discloses the use of configurations and structures that provide tactile feedback. U.S. Patent application publication US 2005/0088417 A1 discloses a tactile touch sensing system that uses a capacitive sensor.

SUMMARY OF THE INVENTION

The invention provides for an organic light emitting diode with capacitive proximity sensing means. Embodiments of the invention are given in the dependant claims.

The proximity of two conductors relative to each other can be sensed by using a capacitive proximity sensor. The capacitance between two conductive objects increases as the objects are brought closer together. A capacitive proximity sensor as understood herein is a sensor that functions either by measuring or detecting a change in the capacitance between two conductors.

Current OLED devices do not integrate tactile feedback. In many applications, both tactile feedback and the illumination of a control are desired. Embodiments of the invention provide for the use of the OLED device as a part of a capacitive switch in combination with a mechanical element to provide tactile feedback. For example, a flexible dome foil placed on top of OLED can be used. By pressing the dome foil it snaps back onto the OLED glass surface. This effect gives a tactile feedback to the user. At the same time the effective capacitance between the OLED surface and ground is changed. The capacitance change can be easily detected using a capacitance sensor. The sensor can have an output which produces a signal based on this capacitance. The signal can be integrated into other electronics or can be used as an input of a control system. This dome foil and OLED combination can be easily adapted to different application areas where differently patterned foils can be used to display different illuminated symbols. This arrangement can be inverted, i.e. the flexible and tactile giving mechanical support structure can be placed under the OLED. The OLED can be supported by an elastomer frame surrounding the OLED. It provides support and allows vertical movement.

Embodiments of the invention provide for an OLED means, a capacitive proximity sensing means, a mechanical element, and a means for providing a signal. The OLED means provides a visual indicator for the operator. The capacitive proximity sensing means allows a means of detecting when the device is operated. The mechanical element is moveable relative to the OLED means. The combined OLED means and mechanical element can be moved relative to each other and can be operated by the user. The means to provide a signal provide embodiments of the invention the ability to be included in a control system or to be embedded within parts of an electronic circuit. The combination of the mechanical element with the OLED means is very advantageous, because it provides for that tactile feedback and it also provides for a variety of different types of switching mechanisms using the capacitive touch screen technology. Possible embodiments are: push button type switches, toggle switches, and sliders.

In another embodiment, the OLED means is adapted to provide tactile feedback to the user. This has the advantage that the user has an indication when the switch has been activated. Adding tactile feedback also gives the possibility of having a control which senses how hard the user presses.

In another embodiment the mechanical element is adapted to provide tactile feedback. Capacitively switched touch panels generally have no feedback for the user providing the mechanical element that provides feedback makes it easier for the user to determine when they press and how hard they are activating the switch. Incorporating a mechanical element also allows a variety of means of activating the switch, a push button, a switch, a slider are examples of how this could be implemented.

In another embodiment, the signal is adapted in several different ways. The signal can indicate a transition between the first and the second position. This has the advantage that a switch can be used as a pushbutton to toggle between two different states. The OLED functionality could be toggled also. This signal can also be adapted to indicate if the mechanical element is in the first or the second position. This has the advantage that the switch can be used to control something which goes between two states. The signal can also be adapted to indicate whether the switch is in the first position, the second position or if it is in the intermediate position. This has the advantage that the switch can be used to control not only an on or off function or being in one of two specific positions but the switch can be variable. The switch can be used for example on a video gaming system where dependent upon how hard one presses the control varies or on an MP3 player. For example, an embodiment of the invention could be incorporated in an MP3 player where the speed of the fast forward function is controlled by how hard the person pushes on the button.

In another embodiment a capacitance is formed between the OLED device and ground. This has the advantage that the mechanical element can provide feedback to the user. In a normal touch panel the user has no tactile feedback. The mechanical element controls or actually restricts the operation of the touch panel by pressing harder or pushing the mechanical element a certain distance the user becomes close enough and the capacitance changes and then the switch is activated.

In another embodiment the OLED means is comprised of a first electrode layer or organic emitting layer and a second electrode layer. An organic light emitting layer is between the first electrode layer and the second electrode layer. Also in this embodiment the mechanical element is comprised of a conductive element. The conductive element is located adjacent to either the first or the second electrode layer. Then a capacitance is formed between the conductive element and the electrode layer which the conductive element is located next to. When the OLED means and the mechanical means are operated by a user the capacitance between the conductive element and the electrode changes, this is detected by a capacitance sensor and is used to control the switching function. This is an extremely advantageous arrangement, because the ground no longer forms part of the current path used for the touch panel. This also has advantages over normal switches, because most switches are mechanical and the capacitive element will not wear out.

In another embodiment the OLED device is connected to the mechanical element by an elastic element. The elastic element enables the relative movement between the mechanical element and the OLED means. The function of the elastic element is to return the OLED device and the mechanical element to the original position before the OLED means was operated by the user. This has the advantage of allowing a construction of a push button type switch. The elastic element also enables the capacitance between the capacitance measurement to vary as a function of how much force is used to operate the OLED means and the mechanical element.

In another embodiment the elastic element is comprised of a mechanical element. The elastic element can be the mechanical element or the elastic element can be partially comprised of the mechanical element. This has the advantage that a dome type switch can be used for implementing embodiments of the invention. A clicker switch can be constructed from an embodiment of the invention. A clicker switch is a switch that physically switches between two states. Clicker switches typically emit a clicking sound, and provide tactile feed back as the switch switches between its two states.

In another embodiment the elastic element is located between the OLED device and the mechanical element. This has the advantage that a mechanical element can be designed which allows the user to feel when the switch has been activated or how much the switch has been activated in the case of a switching device which gives a variable signal depending upon how much it is pressed.

Another embodiment of the invention is further comprised of a mounting structure and the OLED device. The mounting structure is comprised of a front surface and a mounting recess. The mechanical element is comprised of a conducting element which is mounted within the mounting recess. The OLED means are attached to the elastic element, and the elastic element is attached directly to the mounting structure. An electrode of the OLED means is adjacent to the conductive element. Essentially the OLED means are embedded in the elastic element. This has the advantage of providing a switch with a large dynamic range and motion. It also has the advantage that elastic elements which are adapted to transmit light can be used to take advantage of edge light from the OLED means. The OLEDs emit light from the edge this could be transmitted through the elastic element and then directed so that the user can see lights on the panel.

In another embodiment, the elastic element is adapted to transmit light. This has the advantage that the elastic element particularly in the case where surrounding the OLED means or when the OLED means is embedded in the OLED device can be lit by the edge light from the OLED device.

In another embodiment of the invention, the mechanical element is adapted to transmit light. This has the advantage that switches which are backlit can be constructed. The OLED would transmit light through the mechanical element which would be visible to a user.

In another embodiment of the invention the OLED device can also be patterned. This has the advantage that decorative patterns can be applied and it also has the advantage that labeling can be applied to switches and buttons that are embodiments of the invention.

BRIEF DESCRIPTION OF THE DRAWINGS

In the following preferred embodiments of the invention will be described, by way of example only, and with reference to the drawings in which.

DETAILED DESCRIPTION OF EMBODIMENTS

Like numbered elements in these figures are either identical elements or perform the same function. Elements which have been discussed previously will not necessarily be discussed in later figures if the function is identical.

Figure 1:
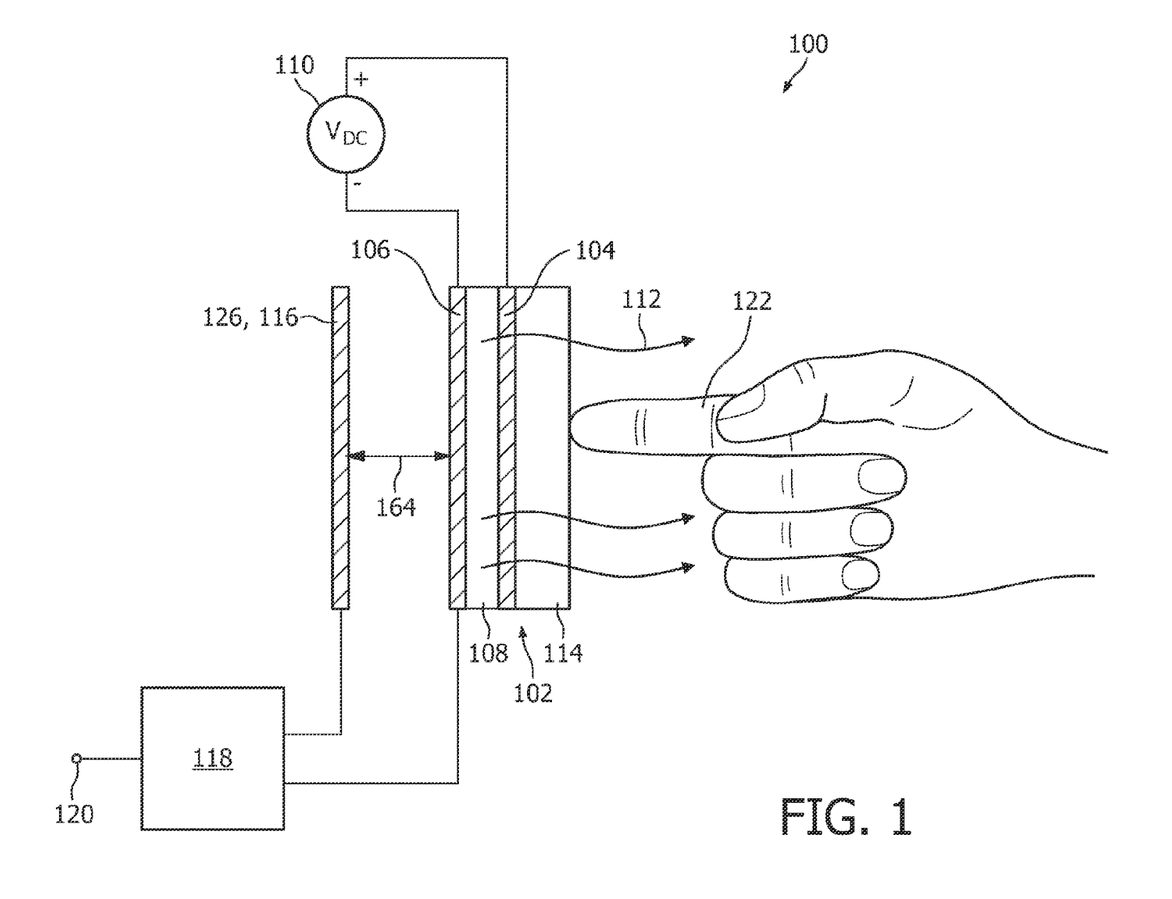
FIG. 1 is a functional schematic showing an embodiment of the invention where the capacitive switch functions by measuring the capacitance between the OLED device and a conductive element.

FIG. 1 is a functional schematic showing an embodiment of an OLED device 100 that functions by measuring the capacitance between the OLED means 102 and a conductive element 116. The OLED means is comprised of an anode 104, a cathode 106, an organic emissive layer 108 and a substrate 114. The OLED means is activated by providing a voltage source 110. When it is activated, light 112 is emitted from the organic layer 108. The cathode 106 is connected in this embodiment to the negative portion of a DC power supply 110 and the anode 104 is connected to the positive terminal on the ADC power supply 110. A capacitive sensor 118 is connected to a conductive element 116 and in this embodiment to the cathode 106.

The finger of an operator 122 operates the OLED means 102. As the operator's finger 122 presses on the OLED means 102, the distance 164 between the conductive element 116 and the cathode 106 changes. The distance 164 changes and the capacitance formed between the conductive element 116 and the cathode 106 changes. This change in the capacitance is detected by the capacitive sensor 118. The capacitive sensor is then integrated into a control system or into other electronics at the capacitive sensor output 120. Depending upon the embodiment of the invention this could take a variety of forms, it could be a digital signal, it could be an analogue signal or it could be a simple output of an electronic circuit.

In alternative embodiments the conductive element can be operated instead of the OLED means 102. In another alternative embodiment, the capacitance could also be formed between the conductive element 116 and the anode 104. Anodes are typically constructed from Indium Tin Oxide (ITO), which is an optically transparent oxide. This allows light, to exit through the anode layer. However, either or both electrodes can be optically transparent in OLED devices. The capacitance between either or both of the electrodes and the conductive element can be used.

Figure 2:
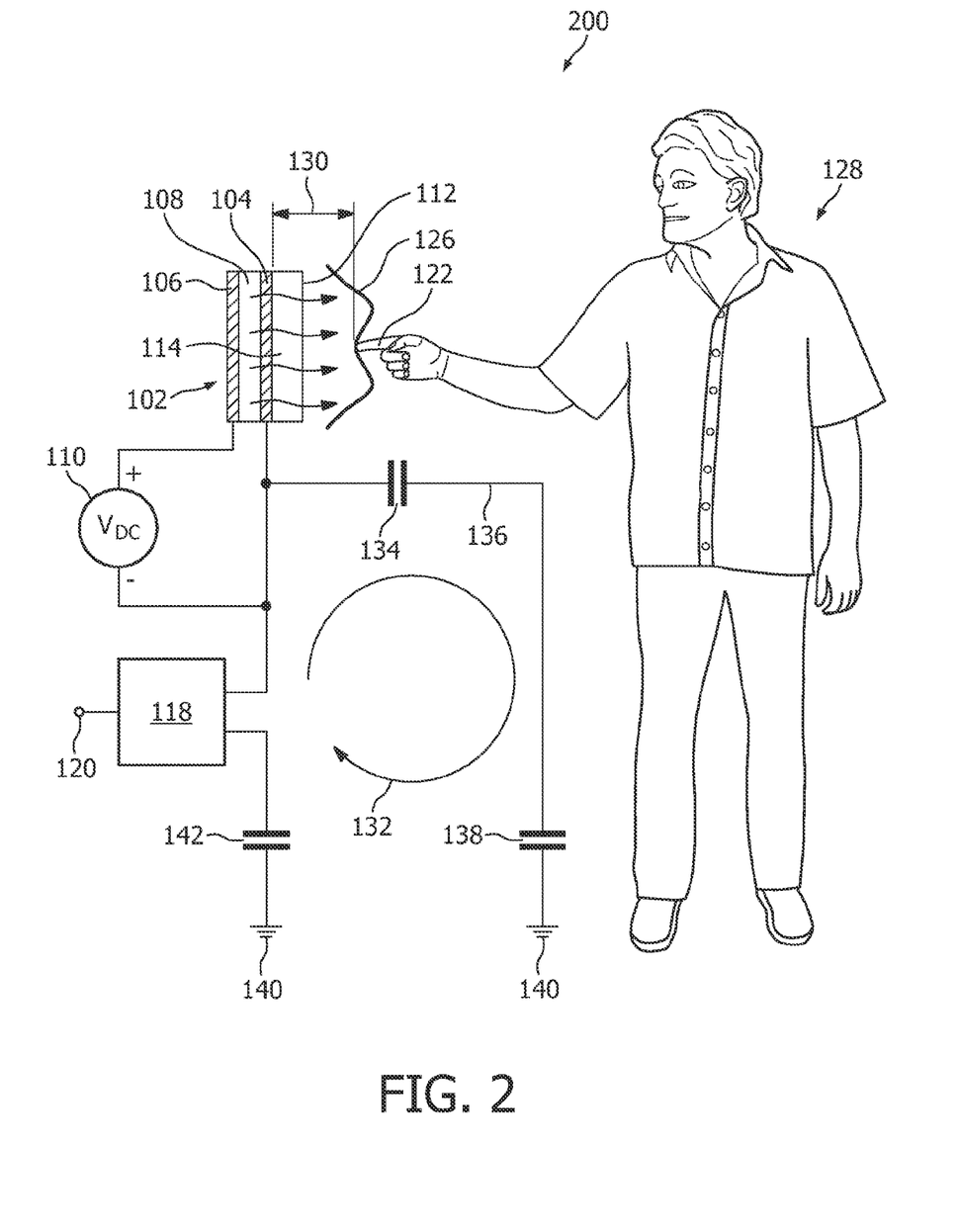
FIG. 2 is a functional schematic showing an embodiment of the invention where the capacitance between ground and the OLED means is sensed.

FIG. 2 shows a functional schematic showing an embodiment an OLED device 200 where the capacitance between the ground and the OLED means is sensed. In this figure, the OLED means 102 is again comprised of an anode 104, a cathode 106 and an organic emissive layer 108. Again the cathode 106 is connected to the negative input of a DC voltage 110 and the anode is connected to the positive input of a DC voltage 110. In this embodiment a capacitance is formed between the finger 122 of a user 128 and the anode 104 of the OLED means 102. As the distance 130 between the finger 122 and the anode 104 changes, the capacitance 134 between the anode 104 and the finger 122 changes. There is then a conducting path 136 through the body of the operator to the ground 140. This capacitance is represented by capacitance 138. This embodiment works by measuring the leakage current, the leakage current is represented as 132. As the distance 130 between the finger 122 and the anode 104 changes this leakage current changes and is able to be detected by a capacitive sensor 118. Typically an AC signal would be put on a surface with a sensor 118 and a leakage current 132 is measured. This capacitive sensor can either be directly connected to the ground 140 or in most cases the device is capacitively coupled to ground anyway. This is represented by capacitance 142. As the capacitance changes this is indicated using the capacitive sensor output 120. Again this can be a digital signal, an analogue signal or it can just be integrated into an electronic circuit directly. In this embodiment the mechanical element 126 restricts the motion of the operator's finger 122. Tactile feedback is provided by the mechanical element 126. This embodiment shows a surface which is deformed but the mechanical element could also be a slider or other element. The capacitive sensor 118 could also be implemented using other means too.

Figure 3:
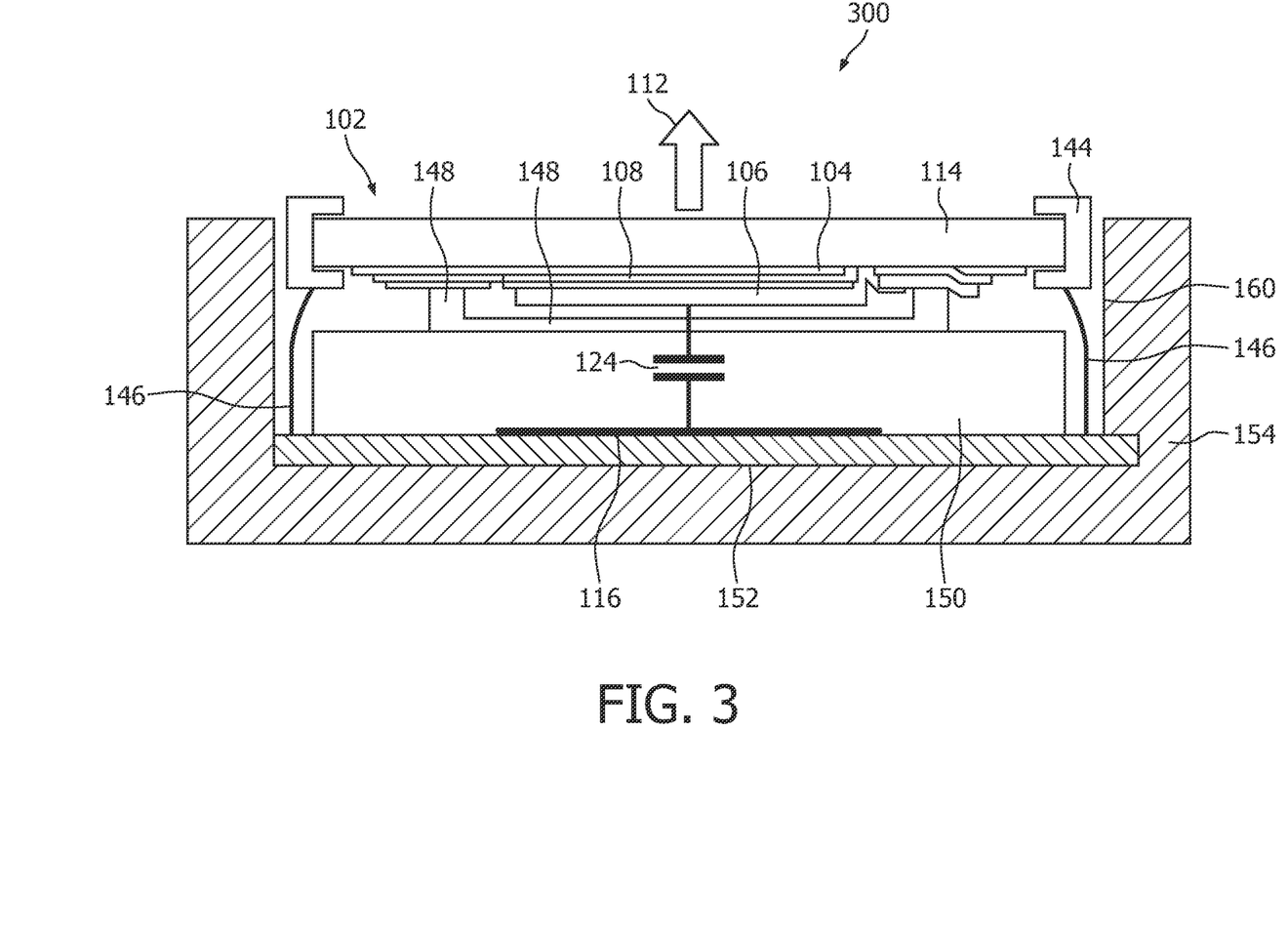
FIG. 3 shows a diagram of an embodiment of the invention where the OLED means is supported by an elastic element.

FIG. 3 shows a diagram of an embodiment of an OLED device 300 where the OLED means 102 is supported by an elastic element. In this figure a substrate 114 is in contact with the anode 104. On the other surface of the anode is an organic emissive layer 108 and on the other side of the organic emissive layer is the cathode 106. The two electrodes are connected to the voltage supply system, the OLED power leads 146. The OLED means 102 is encased within a seal. The OLED means is sensitive to moisture and the seal is there to seal it and prolong lifetime of the OLED means. On the sides of the substrate 114 is located the OLED frame 144. The entire OLED means 102 is mounted onto an elastic element 150. The elastic element is mounted between the OLED means and a conductive element 116. A capacitance 124 is formed between the conductive element 116 and the cathode 106 of the OLED means. The elastic element provides a means of operating and changing the distance between the anode 104 and the conductive element 116. The conductive element 116 is mounted on a printed circuit board 152 in this embodiment and then the printed circuit board 152 is mounted onto a mounting structure 154. The mounting structure could either be a casing and the switch could be mounted in a case or the mounting structure could be part of a control panel and the switch could be integrated into the control panel. In this embodiment the switch is operated by a user pressing on the substrate 114, as the substrate is depressed the distance between the cathode 106 and the conductive element 116 changes. This changes the capacitance 124. These capacitances can then be used by a capacitance sensor to generate a capacitive sensor output for controlling the control system or for controlling an electronic circuit or providing an analogue signal.

In FIG. 3, the OLED is placed on a deformable support, e.g. foam. The capacitance change between one OLED electrode to an electrode on the printed circuit board is detected.

Figure 4:
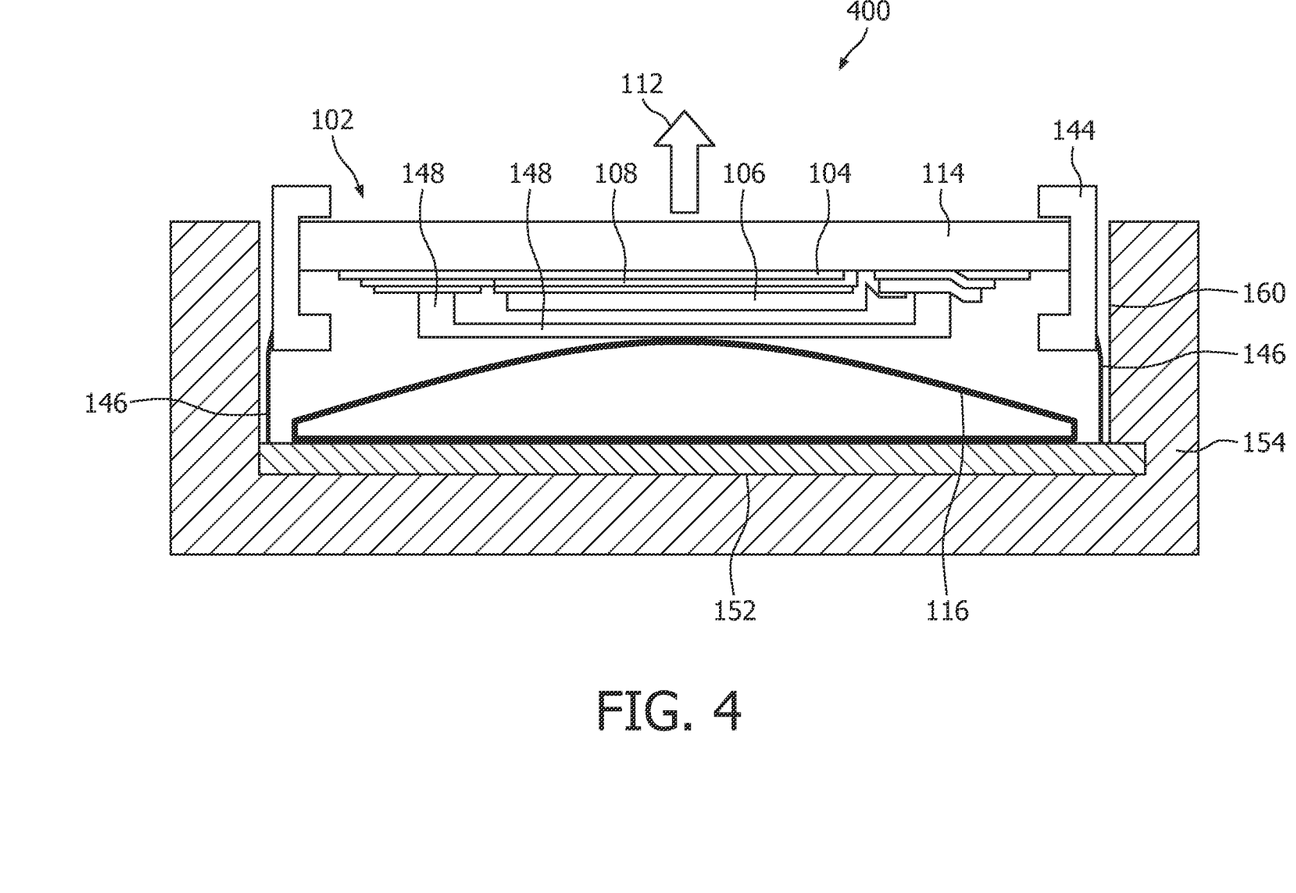
FIG. 4 shows a diagram of an embodiment of the invention where the OLED means is supported by a dome switch.

FIG. 4 shows a diagram of an embodiment of an OLED device 400 where the OLED means is supported on a dome switch. This is very similar to the embodiment shown in FIG. 3, except instead of an elastic element the elastic element is comprised of the conductive element 116. As the dome switch is depressed the capacitance between the dome switch and the cathode 108 changes. This change in capacitance is then used by a capacitive sensor to generate a capacitive sensor output 120. This is used in the same way as the embodiment shown in FIG. 3. FIG. 4 same like FIG. 3 except that foam has been replace by a dome foil which allows the construction of a clicker switch.

Figure 5:
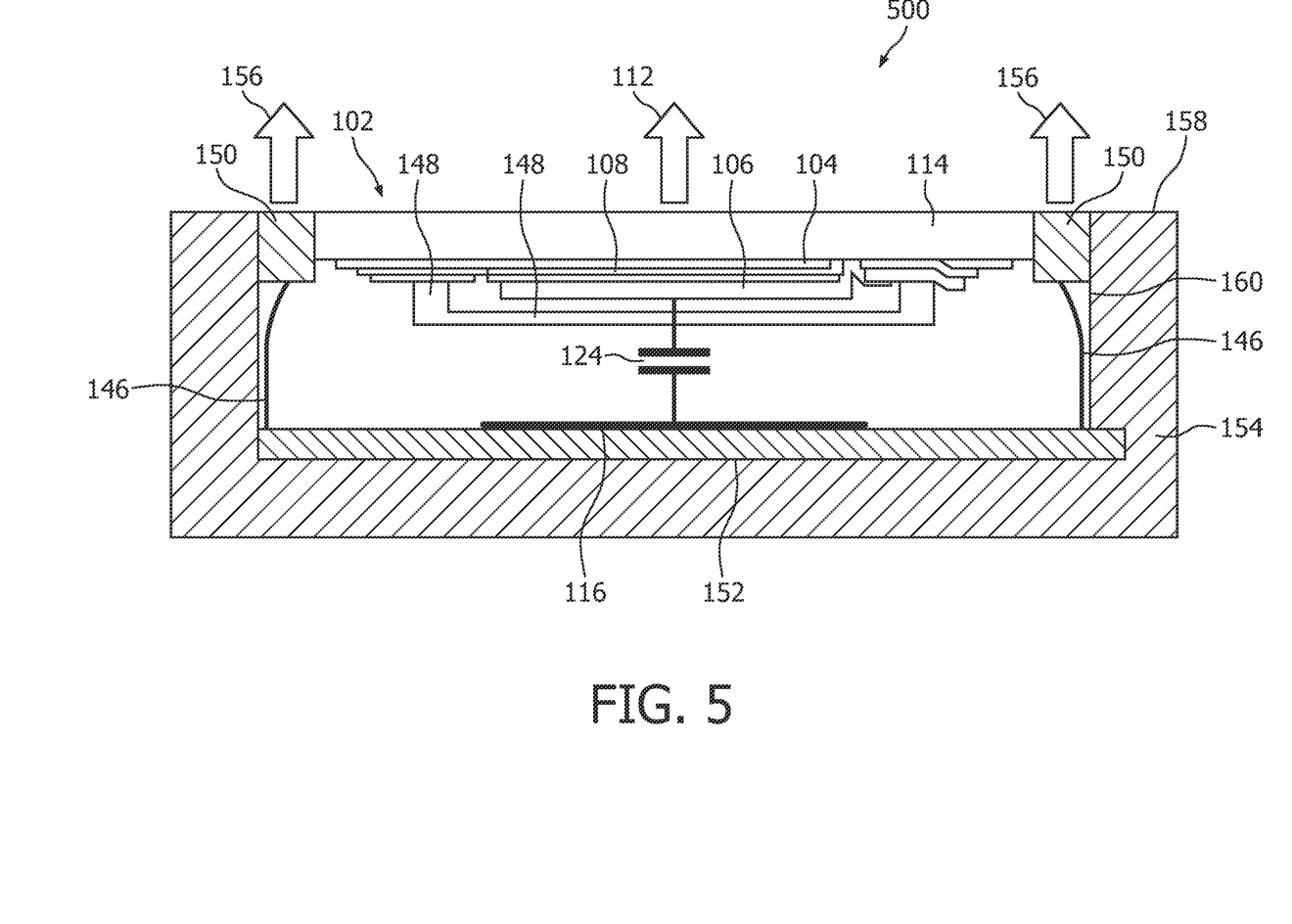
FIG. 5 shows a diagram of an embodiment of the invention where the OLED means is imbedded in the elastic element.

FIG. 5 shows a diagram of an embodiment of an OLED device 500 where the OLED means is embedded in the elastic element. This embodiment is further comprised of a mounting structure 154 and a mounting recess 160. The conductive element 116 is mounted on a printed circuit board 152 that is mounted in the mounting recess 160. The OLED means 102 is then mounted directly to the mounting recess 160 by an elastic element 150. In this embodiment the OLED means 102 is shown as being flush with a front surface 158 of the mounting structure 154. In this embodiment the mounting structure could be a panel or it could be a housing for a switch. The elastic element could be made of a variety of materials. In this embodiment the elastic element is shown as being made of a material that is adapted for transmitting light. In this case the edge light of the OLED device travels through the OLED means and into the elastic element 150. Then edge light 156 is transmitted through the elastic means 150 and directed away from the front surface 158. This is an advantage because the edge light is not wasted and also depending upon the material used for the elastic element 150, a variety of effects can be achieved such as using a translucent material which scatters light or even color. Materials could be used to obtain different color edge lighting effect around the OLED device.

In the embodiment of the OLED device 500 shown in FIG. 5, silicone can be used as the elastic element. The OLED can be imbedded in silicone to fix the OLED in place and to enable vertical motion of the OLED means. The optical transparency of silicone allows it to transmit edge light of the OLED to the front surface of the OLED device. In addition, the elastic element can have its color changed by using colored silicone.

Figure 6:
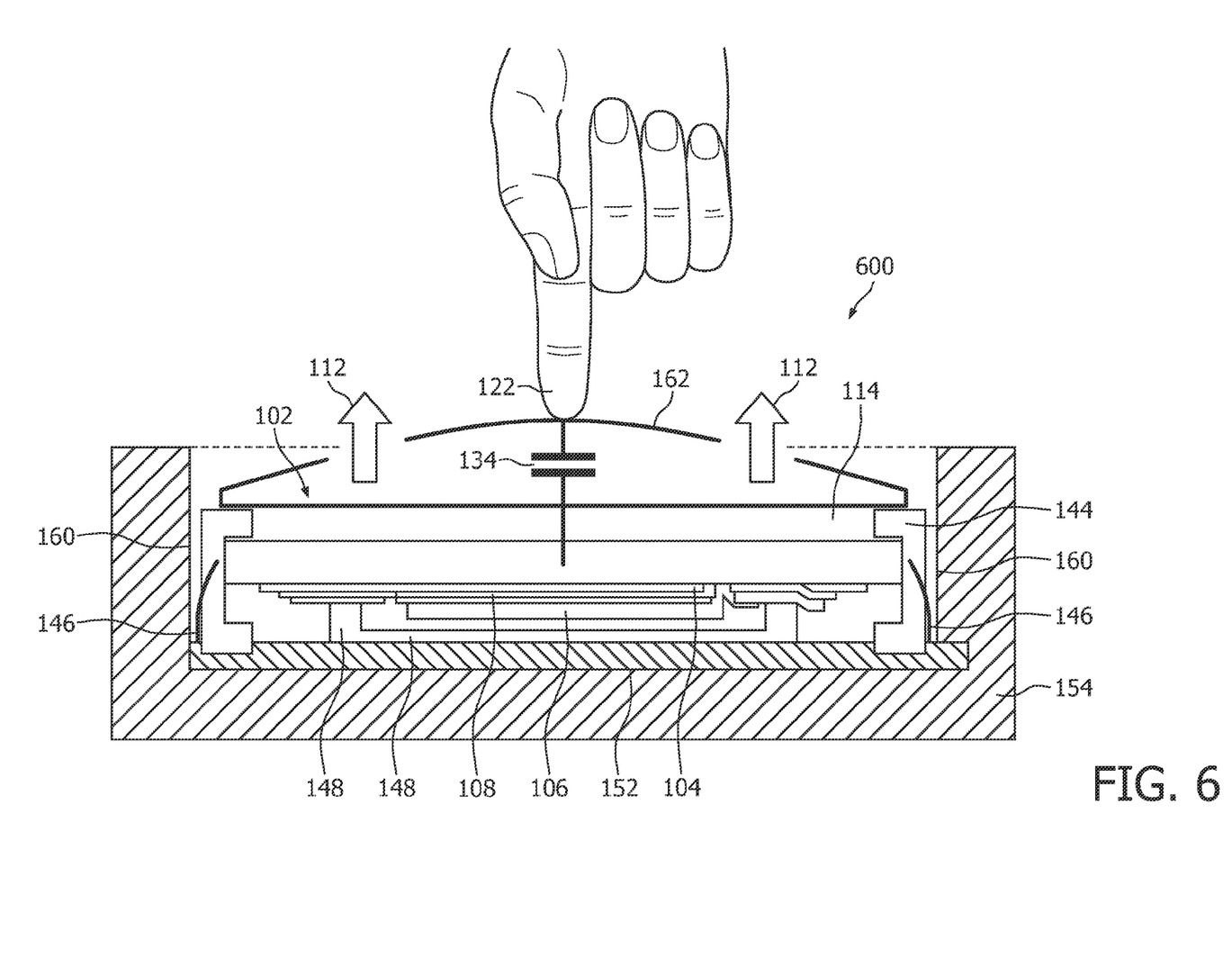
FIG. 6 shows a diagraph of an embodiment of the invention where a deformable dome foil provides tactile feedback.

FIG. 6 shows an embodiment of an OLED device 600 where a flexible dome foil provides tactile feedback. In this embodiment the OLED means 102 and the OLED frame 144 are mounted onto a printed circuit board 152. The printed circuit board is mounted on the mounting structure 154. A flexible dome foil 162 is then located in front of the substrate 114 of the OLED means 102. The purpose of the dome foil is to provide tactile feedback to an operator. In this embodiment an operator depresses the flexible dome foil with a finger 122. To provide a switching means the capacitance between the anode 104 and the operator's finger 122 is detected. This embodiment is identical with the embodiment presented in FIG. 2. This is a highly desirable switch configuration, because the OLED device itself is not moving. The flexible dome switch foil is placed on top of the OLED device. The dome switch foil acts a bi-stable mechanical device. Once a pre-described force is applied to the dome, the foil immediately flattens and gives the user a signal for a successful button press. This abrupt change in distance between a finger tip and one of the OLED electrodes can be detected electronically by capacitive measurements. The dome foil itself can be completely transparent or partially transparent with a symbol printed on.

LIST OF REFERENCE NUMERALS

100 OLED device that senses the capacitance between the OLED device and a conductive element
102 OLED means
104 Anode
106 Cathode
108 Organic emissive layer
110 Electrical power source
112 Emitted light
114 Substrate
116 Conductive element
118 Capacitive sensor
120 Capacitive sensor output
122 Finger
124 Capacitance between OLED electrode and conductive element
126 Mechanical element
128 Operator
130 Distance between anode and finger
132 Leakage current
134 Capacitance between anode and finger
136 Conduction through body of operator
138 Capacitance between operator and ground
140 ground
142 Capacitance between capacitive sensor and ground
144 OLED frame
146 OLED power lead
148 Seal
150 Elastic element
152 Printed Circuit Board
154 Mounting structure
156 Edge light
158 Front surface
160 Mounting recess
162 Dome foil
164 Distance between cathode and conductive element
200 OLED device that senses ground leakage current
300 OLED device supported by elastic element
400 OLED device supported by dome switch
500 OLED device imbedded in elastic element
600 OLED device with deformable dome foil

The invention claimed is:

1. An OLED device, comprising:
    an OLED light source,
    a capacitive proximity sensing means for sensing a change in a capacitance,
    a mechanical element, and
    a means for providing a signal,
        wherein the OLED light source and the mechanical element are movable relative to each other upon operation by a user and can assume a first position or a second position, wherein the capacitance is adapted to change between a first capacitance and a second capacitance when the OLED light source and mechanical element are moved between the first position and the second position by an operator, and wherein the signal depends upon the capacitance,
        wherein the OLED light source comprise
            a first electrode layer,
            an organic light emitting layer, and
            a second electrode layer,
        wherein the organic light emitting layer is between the first electrode layer and the second electrode layer,
        wherein the mechanical element comprises a conductive element adjacent to one of the first electrode layer or the second electrode layer, and
        wherein capacitance is formed between the one of the first electrode layer and the second electrode layer and the conductive element.

2. The OLED device of claim 1, herein the OLED light source is adapted to provide tactile feedback.

3. The OLED device of claim 1, wherein the mechanical element is adapted to provide tactile feedback.

4. The OLED device of claim 3, wherein the mechanical element is selected from the group consisting of a button, a switch, and a dome foil structure.

5. The OLED device of claim 1, wherein the signal is adapted to one of:
    indicate a transition between the first and the second position,
    indicate if the OLED light source and the mechanical element are in the first position or in the second position, and
    indicate if the OLED light source and the mechanical element are in the first position, the second position, or in an intermediate position and wherein the intermediate position is a position intermediate to the first and the second position that is assumed when the OLED light source and the mechanical element are moving between the first position and the second position.

6. The OLED device of claim 1, wherein the capacitance is formed between the OLED light source and ground.

7. The OLED device of claim 1, wherein the OLED light source is connected to the mechanical element by an elastic element to enable relative movement between the mechanical element and the OLED light source.

8. The OLED device of claim 7, wherein the elastic element is between the OLED light source and the mechanical element.

9. The OLED device of claim 7, further comprising a mounting structure, wherein OLED device is mounted to the mounting structure, wherein the mounting structure is comprised of a front surface and a mounting recess, wherein the conducting element is mounted within the mounting recess, wherein the OLED light source are attached to the elastic element, wherein the elastic element is attached to the mounting structure, and wherein the OLED light source is one of: mounted flush with the front surface or mounted protruding beyond the front surface.

10. The OLED device of claim 7, wherein the elastic element is adapted to transmit light.

11. The OLED device of claim 1, wherein the mechanical element is adapted to transmit light.

12. The OLED device of claim 1, wherein the OLED device is patterned.

* * * * *